United States Patent [19]

Neugebauer et al.

[11] Patent Number: 5,231,049
[45] Date of Patent: Jul. 27, 1993

[54] METHOD OF MANUFACTURING A DISTRIBUTED LIGHT EMITTING DIODE FLAT-SCREEN DISPLAY FOR USE IN TELEVISIONS

[75] Inventors: Charles F. Neugebauer, Pasadena; Amnon Yariv, San Marino, both of Calif.

[73] Assignee: California Institute of Technology, Pasadena, Calif.

[21] Appl. No.: 830,369

[22] Filed: Jan. 31, 1992

Related U.S. Application Data

[63] Continuation-in-part of Ser. No. 609,404, Nov. 5, 1990, Pat. No. 5,102,824.

[51] Int. Cl.$^5$ ............................................. H01L 21/20
[52] U.S. Cl. ................................... 437/128; 437/906; 437/23; 437/209; 148/DIG. 99; 148/DIG. 45
[58] Field of Search .............. 437/128, 127, 905, 904, 437/906, DIG. 99; 313/461, 500, 499, 463, 505; 340/762, 781, 782

[56] References Cited

U.S. PATENT DOCUMENTS

| | | | |
|---|---|---|---|
| 2,888,593 | 5/1959 | Anderson et al. | 313/463 |
| 3,701,123 | 10/1972 | Barrett et al. | 340/781 |
| 4,139,797 | 2/1979 | Rowe | 313/472 |
| 4,140,941 | 2/1979 | Uemura | 313/472 |
| 4,280,125 | 7/1981 | Kazan | 313/531 |
| 4,280,273 | 7/1981 | Vincent | 437/906 |
| 4,432,131 | 2/1984 | Sandamasa et al. | 437/906 |
| 4,575,765 | 3/1986 | Hirt | 358/241 |
| 4,754,202 | 6/1988 | Havel | 340/782 |
| 4,845,405 | 7/1989 | Yamane et al. | 340/762 |
| 4,924,144 | 5/1990 | Menn et al. | 313/505 |

Primary Examiner—Brian E. Hearn
Assistant Examiner—Michael Trinh
Attorney, Agent, or Firm—Leonard Tachner

[57] ABSTRACT

A novel display screen structure and method of manufacturing such screens for use, for example, in large screen television displays. The process of the present invention is one which can be accomplished with no new materials, no critical geometric requirements such as critical separations and alignments and only low voltage drivers. The combination of these features results in a technology which can be easily scaled to large sizes to provide relatively low-cost large screens for televisions. An important step in a first embodiment of the present invention is the alignment of a large plurality of columnar-shaped light emitting diode slivers in an uncured optical epoxy by applying an electric field through a mixture of such slivers and epoxy and then curing the epoxy to effectively fix the light emitting diode slivers in that aligned configuration. In a second embodiment, the LED slivers are mixed with molten glass which is formed into elongated glass fibers. The fibers are sandwiched between conductive glass plates and heated while an aligning voltage is applied. The light being emitted by such diodes is thereafter controlled by orthogonally directed electrodes at least one of which is optically transparent and which are placed on opposing surfaces of the thin plate-like structure fabricated in accordance with the invention.

6 Claims, 8 Drawing Sheets

METHOD OF MANUFACTURING A DISTRIBUTED LIGHT EMITTING DIODE FLAT-SCREEN DISPLAY FOR USE IN TELEVISIONS

CROSS-REFERENCE TO RELATED APPLICATIONS

This application is a continuation-in-part of application Ser. No. 07/609,404 filed on Nov. 5, 1990 now U.S. Pat. No. 5,102,824, issued Apr. 7, 1992.

TECHNICAL FIELD

The present invention relates generally to the manufacture of large screen displays, such as those used in flat-screen televisions, and more specifically, to a manufacturing technology for making large screen displays, wherein light emitting diode wafers are divided and distributed across the screen.

BACKGROUND ART

Large screen televisions have not made deep in-roads into the consumer market for a number of reasons. Currently, the largest cathode ray tubes are approximately thirty-five inches measured diagonally and are very heavy, i.e. over 100 pounds. Vacuum technology limits the size of the screen. The larger the screen, the more glass is needed to keep the vacuum intact and the heavier the screen gets. Direct view tube technology, after serving as the work-horse of the industry, has reached its limits when it comes to larger screens. The big screen televisions currently being marketed are of the projection type. These screens use a small, extremely bright source (either a cathode ray tube or a transmissive liquid crystal display screen) and magnify it to a large size using conventional optics. Besides being bulky, such screens have a number of practical limits. There exist trade-offs between source brightness, tube lifetime, optical aberrations and viewing angle that generally result in poor image quality for such systems, as compared to direct view cathode ray tube televisions.

In essence, what one would like is a screen technology that scales up better with size. Twenty five inch tubes cost orders of magnitude less to produce than a forty inch tube which has three times the screen area of a conventional size tube. Tube technology does not scale well, and thus what one needs is a screen that costs a fixed amount per square foot. In addition, although most televisions today are sold as large boxes, one would expect large TVs of the future to be flat screens, simply because a six foot screen contained in a six foot square box is not very practical, but a six foot screen, mounted on a wall and taking up only wall space, would be practical.

A number of flat panel technologies intended for large screen home use have been explored in the last twenty years or so, but each has its own problems. Liquid crystal displays are most often seen in calculators and lap-top computers. The liquid crystal is sandwiched between two polarizers and introduces a voltage controlled polorization rotation of the incident light. Thus, elements of the liquid crystal display can be made clear or opaque, simply by applying a voltage. The problem with this technology is that it does not scale very well. The amount of phase rotation, in addition to being proportional to the applied voltage, is also proportional to the distance between the front and back polarizers. This distance must be controlled to a few tens of microns across the entire area of the screen. Unfortunately this is virtually impossible because large screens are simply not sufficiently rigid, i.e. they flex under gravity. Making such screens thicker is not a viable solution because thicker screens get even heavier.

The LCD is a voltage controlled device. In order to selectively turn "on" one pixel, a voltage, $V_x$, must be applied to a horizontal electrode (corresponding to that pixel) and another voltage, $-V_y$, must be applied to the vertical electrode, so that the pixel sees a voltage drop of $V_x+V_y$. Note that if all other horizontal and vertical electrodes are held at ground potential, the screen will have other pixels with $V_x$ and $V_y$ across them. Thus, with a voltage controlled device, "crosstalk" occurs, i.e., turning "on" one pixel slightly turns "on" other neighboring pixels.

The LCD industry has gotten around this by making an "active matrix" LCD where each pixel has its own transistor driver. This resolves the crosstalk problem but introduces severe manufacturing constraints. Chip lithography (accurate to $\sim 1$ μm alignment) across a large screen ($\sim 1m^2$) with multiple mask layers is nearly impossible and not very cost effective since the yield is very low. Ideally, what one wants is a directional current device (a diode) at each pixel to eliminate crosstalk, no critical alignments, and robustness against pixel fabrication errors. This fact has limited liquid crystal display screens to small sizes, such as less than thirteen inches diagonally.

Another flat panel technology that suffers from this same problem is plasma display technology. In this technology, exciting electrodes must be properly spaced across a large area. This is not a trivial task. In addition, plasma displays require high driving voltages, i.e. a few kilivolts. The nature of flat panel technology requires X—Y addressing electrodes, one for each horizontal and vertical line of resolution. Thus a thousand by thousand pixel screen requires two thousand drive lines. Plasma displays need high voltage drivers (i.e., high voltage semiconductors) for every line, making them prohibitively expensive for home use.

Another major flat panel technology consists of electroluminescent screens made of phosphors, sandwiched between X—Y electrodes. This device is solid and does not have plate separation problems like the previously discussed approaches. It does, however, require high voltage drivers to excite the phosphors, thereby again making high resolution infeasible for home use.

There is therefore an ongoing need to provide a way of overcoming the obstacles of the noted previous technologies to provide an improved display screen and method of manufacture thereof, which is especially conducive to the manufacture of large screen televisions without suffering the aforementioned disadvantages of the prior art.

SUMMARY OF THE INVENTION

The present invention comprises a novel method and apparatus exploiting light emitting diodes to overcome the obstacles of previous technologies, including such obstacles as large area plate separation tolerances and high voltage line drivers. The basic properties of standard light emitting diode technology match the needs of display technology. Light emitting diodes are reasonably efficient in converting electrical power to optical power and require only low driving voltages. However, standard light emitting diodes are much too bright and require too much current for use in everyday television screens. Furthermore, one of the most critical needs in manufacturing technology for televisions is that it be simple and thus low cost. Therefore, placing a pre-packaged light emitting diode at every pixel location in a TV display would not be easy, nor inexpensive. Ideally, what would be desirable is a "spray-on" technology, where the screen is made by coating a substrate with something easily applied and then adding electrodes. The present invention affords a unique low cost manufacturing technique which is tantamount to such a "spray-on" technology.

The first step in the method of the present invention comprises the growth of a wafer with a light emitting PN junction and a sacrificial buffer layer such as of aluminum arsenide. Contact layers are grown on both sides of the junction and a metal contact such as a gold germanium contact is alloyed at this stage. Eventually, light emitting diode slivers are produced and these slivers are mixed with a curable optical epoxy. The light emitting diode slivers are then aligned electrically before the epoxy is cured. Ultimately, horizontal and vertical electrodes are applied using lithographic techniques, producing a large array of light emitting diode slivers whose pixels are easily addressable with low voltage drivers connected to horizontal and vertical lines. This technology can be readily used for making color television screens by combining three separate screen having respectively red, green and blue light emitting diode slivers. In a second embodiment of the invention, the LED slivers are mixed with molten glass and formed into a cylinder. The cylinder is then drawn into a glass fiber. Three different color fibers are made, one for each of red, green and blue. These fibers are then sliced into lengths equal to the screen width and placed between two alignment plates. The plates are heated and a voltage is applied to align the LEDs. The glass fibers flow together to form a continuous plate of material. The electrodes are then applied using the described lithographic techniques. The method of the present invention may thus be used for producing large screen television displays which involve no new materials, no critical separations, no critical alignments and only low voltage drivers. The technology of the present invention can be readily scaled up to make extremely large television screens.

OBJECTS OF THE INVENTION

It is therefore a principal object of the present invention to provide a television screen that is made from a large plurality of light emitting diode slivers manufactured in accordance with a unique low cost method which obviates the prior art requirements for critical separation distances and alignments and the use of high voltage drivers.

It is an additional object of the present invention to provide a unique flat screen display for use in televisions and the like and which may be readily employed for manufacturing large screen televisions that are both technically feasible and relatively inexpensive.

It is still an additional object of the present invention to provide a method for manufacturing large screens for televisions and the like, wherein a large plurality of light emitting diode devices are disbursed in molten glass fibers within which they may be readily aligned between alignment plates by exploiting the intrinsic dipole moment of such light emitting diodes and then subsequently applying transparent horizontal and vertical electrodes forming addressable pixels wherever such electrodes cross.

BRIEF DESCRIPTION OF THE DRAWINGS

The aforementioned objects and advantages of the invention, as well as additional objects and advantages thereof, will be more fully understood hereinafter as a result of a detailed description of a preferred embodiment when taken in conjunction with the following drawings in which:

FIG. 10 illustrates the application of a glass substrate to the surface of the present invention to which electrodes have been applied in the step of FIGS. 9 and 9a;

DETAILED DESCRIPTION OF A PREFERRED EMBODIMENT

Figure 1:
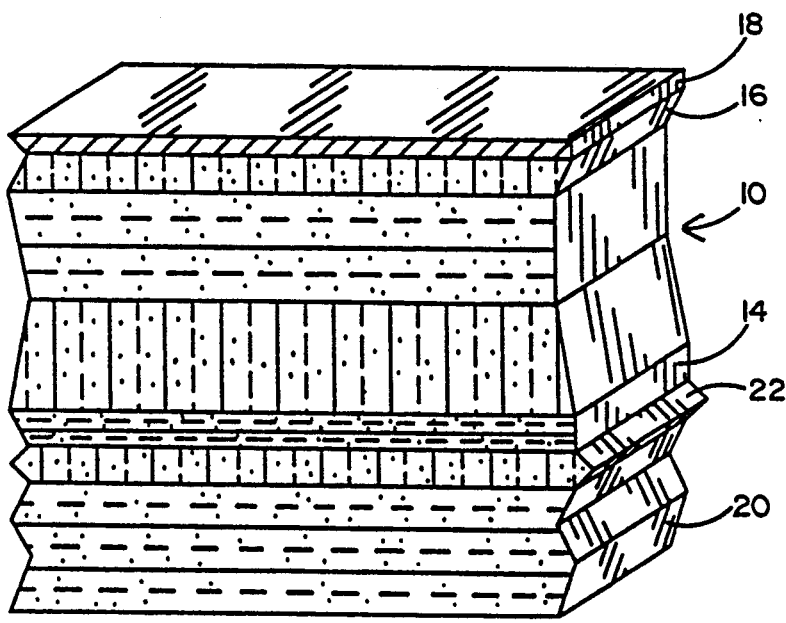
FIG. 1 is a cross-sectional drawing of a wafer grown in accordance with the first step of the method of the present invention.

Referring now first to FIG. 1, it will be seen that the first step in the process of the present invention comprises the step of growing a wafer providing a light emitting PN junction 10 and a "sacrificial" buffer layer 12 of aluminum arsenide (AlAs). Contact layers 14 and 16 are grown on both sides of the PN junction and a gold germanium contact 18 is alloyed at this stage of the process. The resulting wafer configuration comprises a gallium arsenide base 20 upon which there is placed an aluminum arsenide buffer 22, a PN junction 10 of aluminum gallium arsenide separated from the buffer 12 on one side by positively doped gallium arsenide 14 and negatively doped aluminum gallium arsenide 16 on the other side thereof. The positively and negatively doped layers above and below the junction constitute the contact layers. Finally, a contact 18 of gold and germanium is alloyed to the upper surface of wafer.

Figure 2:
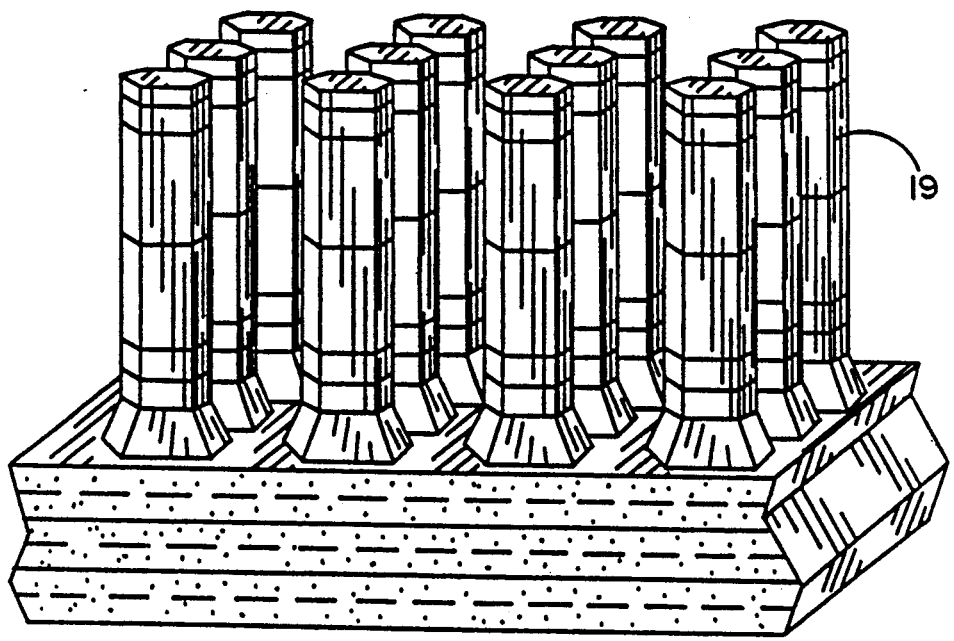
FIG. 2 is a perspective view of the vertically etched wafer in accordance with a second step of the present invention.
Figure 3:
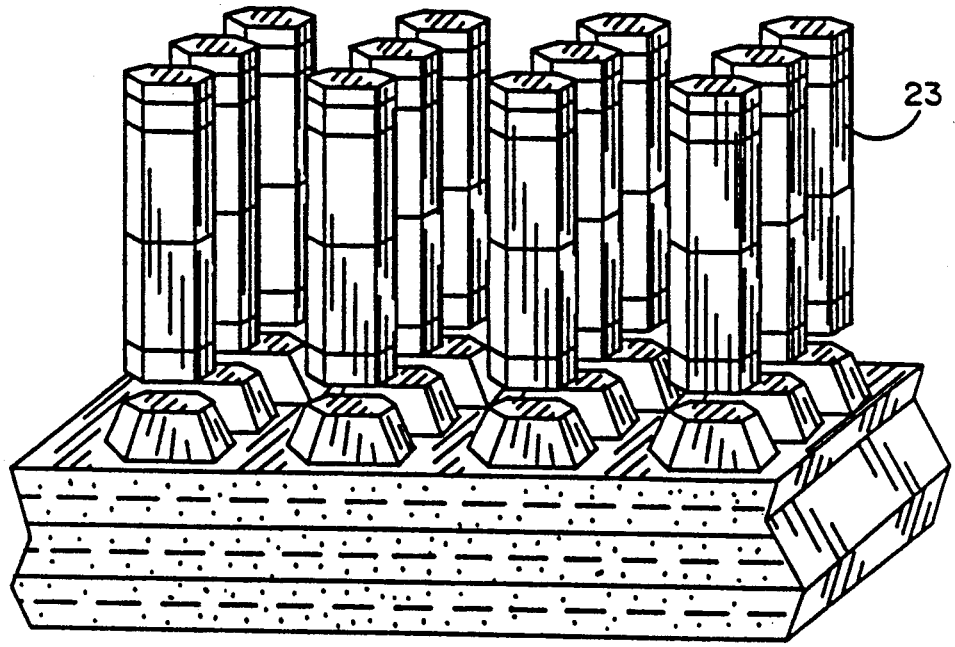
FIG. 3 is a view similar to that of FIG. 2, but showing a selective etching in accordance with a third step of the present invention.
Figure 4:
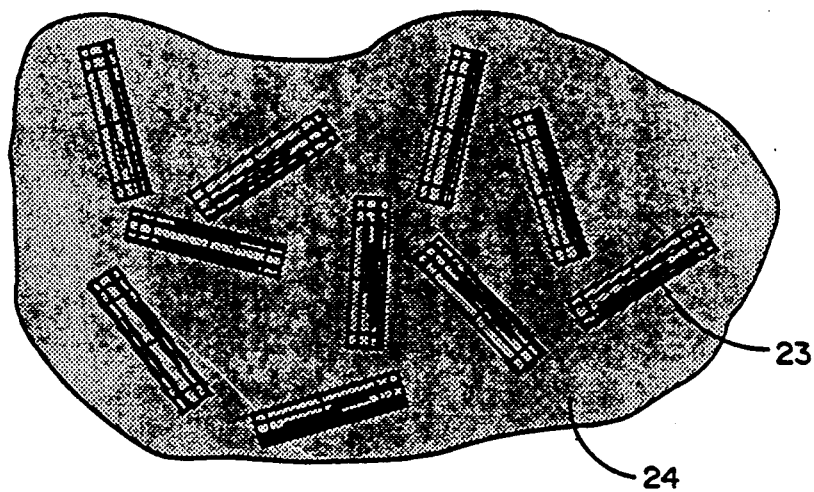
FIG. 4 is a representation of a collection of light emitting diode slivers mixed within a curable optical epoxy in accordance with the next step of a first embodiment of the present invention.
Figure 5:
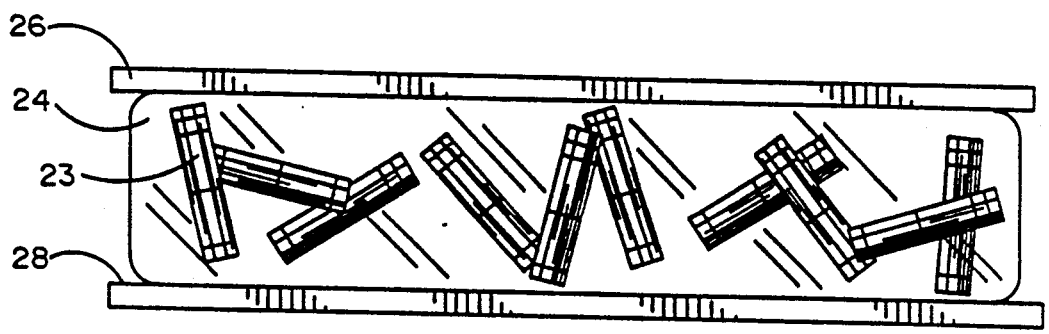
FIG. 5 is a representation of the application of the mixture of FIG. 4 to the space between a pair of large conducting plates in preparation for the alignment step of the first embodiment of the present invention.

Referring to FIG. 2, it will be seen that the second step of the present invention comprises the use of a vertical etching technique, such as reactive ion etching, to create a plurality of parallel columns 19. The wafer is etched so that all of the grown layers are uncovered, that is, all of the layers above the substrate. In FIG. 3, it will be seen that the third step of the present invention comprises the step of applying a chemical etchant, such as hydrofluoric acid, that will selectively etch only the sacrificial aluminum arsenide, thus breaking off the individual light emitting diode columns to form a plurality of light emitting diode slivers 23. As shown in FIG. 4, these light emitting diode slivers are then mixed with a curable optical epoxy 24 such as Norland Products, Inc., Part No. NOA60 or a monomer such as methylmethacrylate. Typically, such epoxys may be cured either by applying heat, ultra-violet light or one or more chemical constituents. However, before this curing process by any of these well known means is implemented, the combination of light emitting diode slivers and curable optical epoxy is poured between two large conducting plates 26 and 28 separated by a distance which is slightly greater than the length of the light emitting diode slivers 23. This step in the process of the present invention is illustrated in FIG. 5. In typical applications for a preferred embodiment of the invention as contemplated herein, each light emitting diode sliver would have a length of approximately 20 micrometers and a diameter of approximately 2 micrometers. Accordingly, in typical applications of the step of the present invention illustrated in FIG. 5, the separation between the conducting plates would be approximately 25 micrometers.

Figure 6:
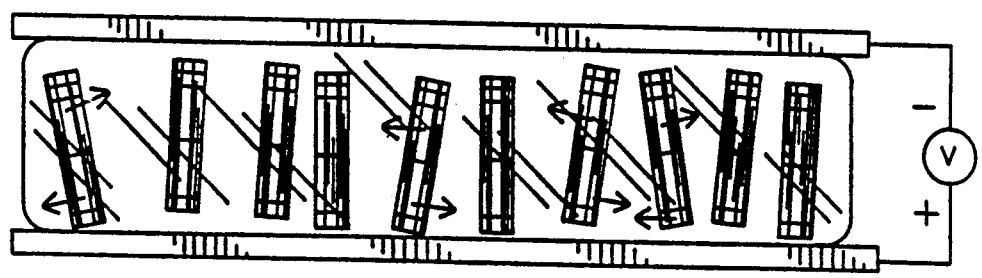
FIG. 6 is a representation of the alignment step of the first embodiment.

The next step of the present invention which is illustrated in FIG. 6 herein, is that of applying an electric field by generating a voltage across the plates between which the mixture of light emitting diode slivers and curable optical epoxy has been placed. This electric field acts to identically align the light emitting diode slivers because PN junctions have an intrinsic dipole moment. It is believed that the amount of voltage for the space contemplated between the conducting plates required to align the light emitting diode slivers, would be on the order of 10 volts and the amount of time required to permit the alignment of the light emitting diode slivers would be on the order of 10 seconds or less, depending, of course, on various parameters associated with the dimensions and materials such as the viscosity of the uncured optical epoxy.

Figure 7:
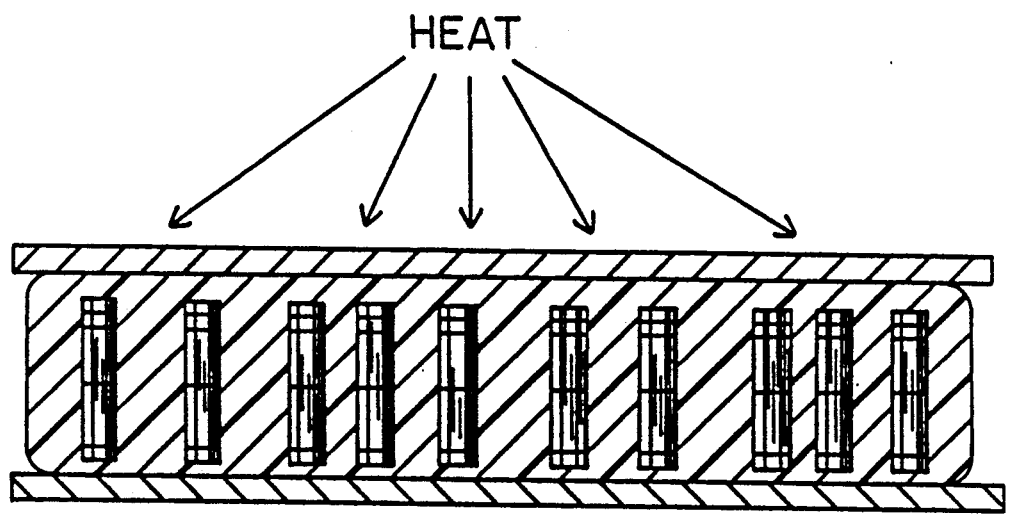
FIG. 7 is a representation of the curing step of the first embodiment.

The next step in the process of the present invention is that of curing the epoxy. Such curing will, of course, depend upon the nature of the epoxy. FIG. 7 illustrates that this step is accomplished by the application of heat to the plates which form the upper and lower boundaries of the light emitting diode sliver/epoxy mixture. However, this step may also be carried out by the application of ultra-violet light or the use of a chemical additive which initiates the curing of the epoxy. Thus, the step of the present invention illustrated in FIG. 7 should be understood as a step which does not necessarily require curing by the application of heat, but is instead deemed to be a generic curing step, the details of which depend upon the nature of the epoxy material used therein.

Figure 10:
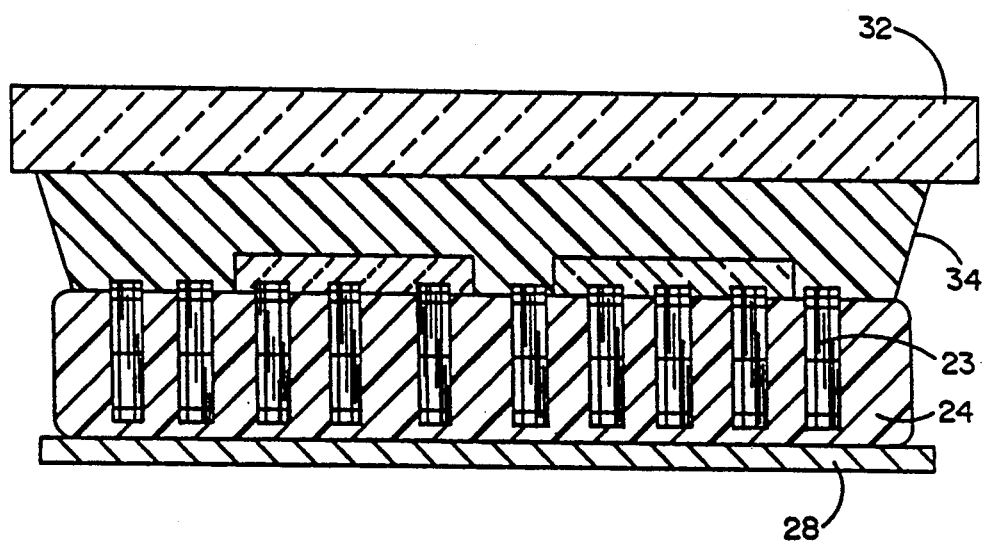
Figure 8:
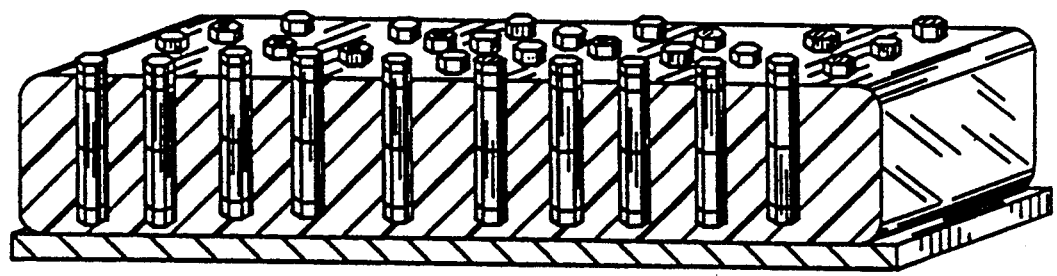
FIG. 8 is a representation of a post-epoxy curing etching step of the first embodiment.
Figure 9A:
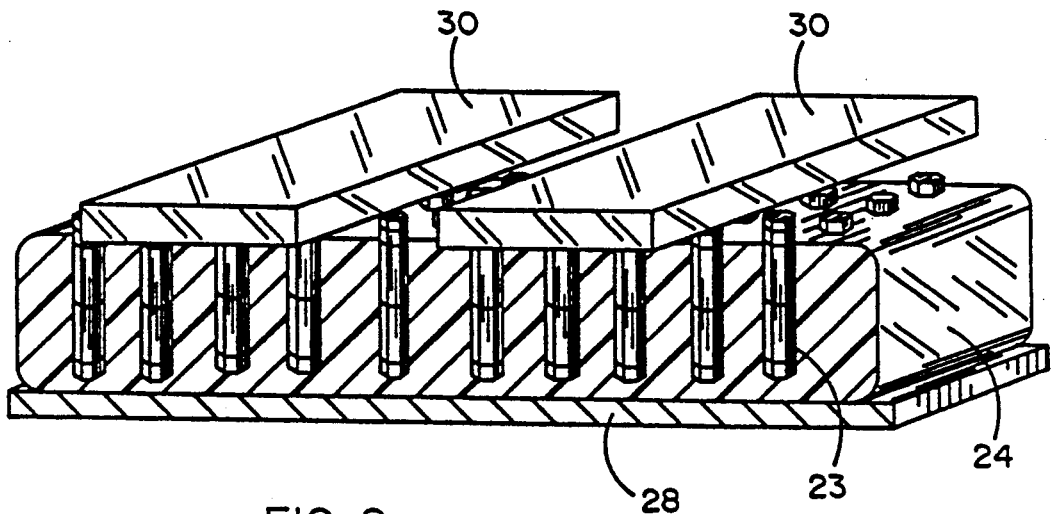
FIGS. 9 and 9a represent the top view and side view, respectively, of a subsequent step in the present invention wherein electrodes are applied to one surface thereof.
Figure 9:
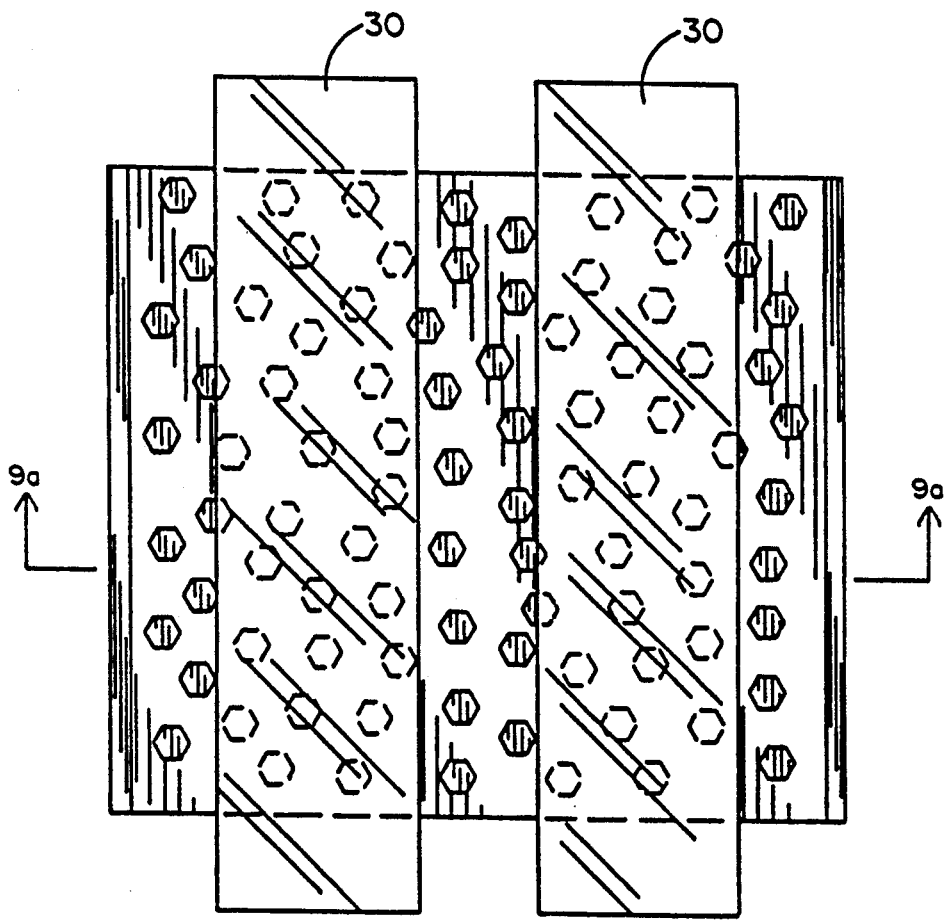
Figure 11:
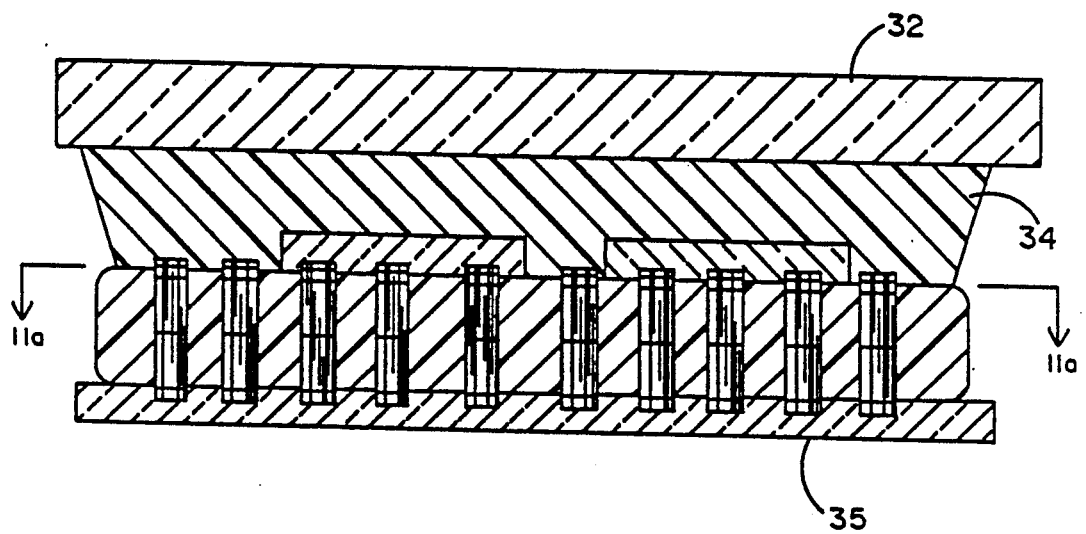
FIGS. 11 and 11a illustrate the application of electrodes to the remaining side of the present invention.
Figure 11A:
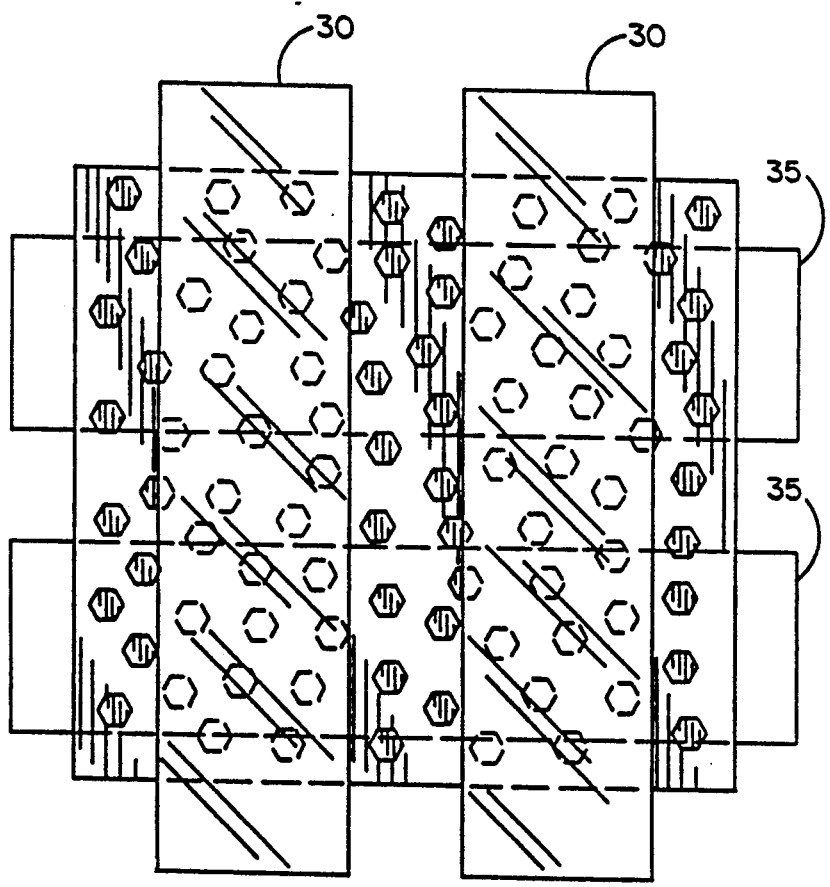

The next step of the present invention, which is illustrated in FIG. 8, comprises the step of removing one of the plates used previously to apply an electric field across the mixture of epoxy and LED slivers. After the plate has been removed, the epoxy immediately beneath the plate is chemically etched to uncover all gold germanium alloyed ends of the aligned light emitting diode slivers as shown in FIG. 8. The next step in the process of the present invention is the application of electrodes 30 to the exposed and etched surface of the display, that is, to one axial surface of the LED slivers using standard transparent electrodes and lithographic techniques. This step is illustrated in FIGS. 9 and 9a. These electrodes define the height of the pixel and in the preferred embodiment of the invention shown herein, are approximately 1 millimeter in width. These electrodes are then attached to a sturdy substrate 32, such as glass, with additional epoxy 34 as shown in FIG. 10. Next, the other conducting plate is removed in the same manner. The epoxy is etched and another set of electrodes 35 are applied to that surface, in the same manner as previously described. However, in this particular instance, the electrodes are applied orthogonally to the previously applied electrodes as shown in FIG. 11 and 11a. This step completes the process.

The manufactured product of the present invention may be described as a large array of light emitting diodes whose pixels are easily addressable with low voltage drivers connected to horizontal and vertical lines. The brightness of the light emitting diodes is diluted to current TV light output levels and power consumption is spread over a large area. Most importantly, the manufacturing process of the present invention is exceedingly simple, involving no handling of individual pixel elements and no critical alignments over the area of the screen. The pixels are formed wherever horizontal and vertical electrodes cross in cross-section. The area of each pixel is expected to be approximately one square millimeter, while the sliver density is expected to be approximately one hundred per square millimeter. This obviates the need for any special processing equipment for aligning the light emitting diode slivers with the electrodes. It is only necessary to produce a statistical average of about 100 light emitting diode slivers per pixel. By controlling the sliver density within the epoxy when the mixture is made, the brightness of the screen can be controlled. In addition, because the screen is solid and does not rely on any critical separations, large screens can be built without incurring any scaling problems.

Because the light emitting diode slivers are expected to be relatively sparse within the clear epoxy and because the entire structure is reasonably thin, color screens can be made by manufacturing three such screens, using red, green and blue light emitting diode wafers. These screens can then be stacked, one on top of another. The light of the screen furthest back, is reduced slightly as it passes through the mostly transparent upper screens. By controlling the electrodes with red, green and blue information, color displays can be readily achieved.

Light emitting diode material outside the depletion region of the PN junction acts as an absorber for the light produced. Because the light emitting diodes are aligned to point at the viewer, the light directed toward the viewer will be mostly absorbed. Light emitted out from the sides will enter the epoxy and some will become scattered toward the viewer. A simple way to alleviate this absorption is to use double heterojunction light emitting diodes which are optically transparent to the emitted light. In this manner, the viewer will receive direct emitted diode light.

Figure 12:
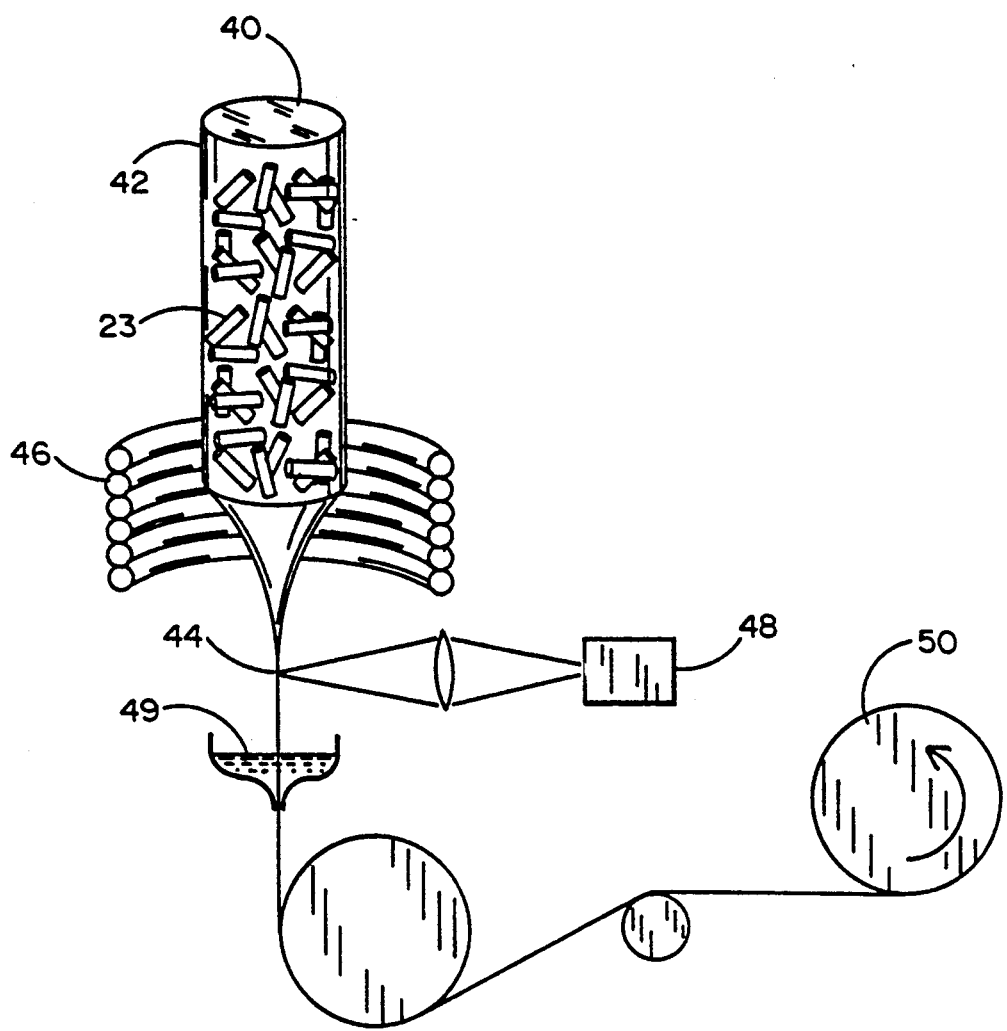
FIG. 12 illustrates a step in the second embodiment of the invention wherein the LED slivers are formed into glass fibers.
Figure 13:
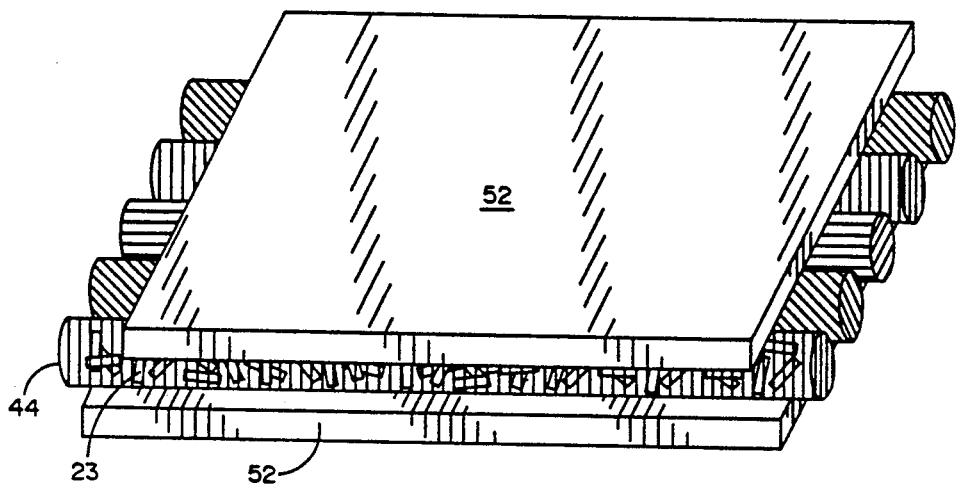
FIG. 13 illustrates an additional step in the second embodiment wherein individual fibers of different colors are positioned side by side between two alignment plates.
Figure 14A:
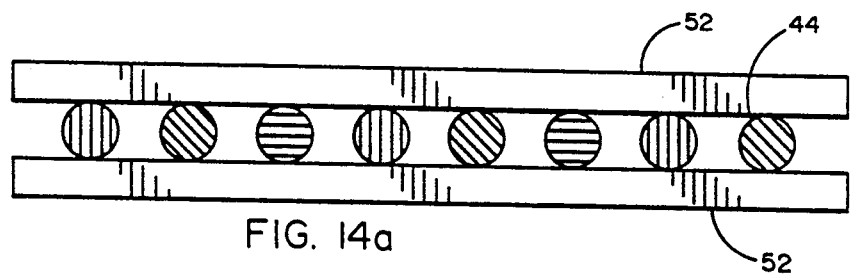
FIG. 14(a), (b) and (c) illustrate the alignment step of the second embodiment.
Figure 14B:
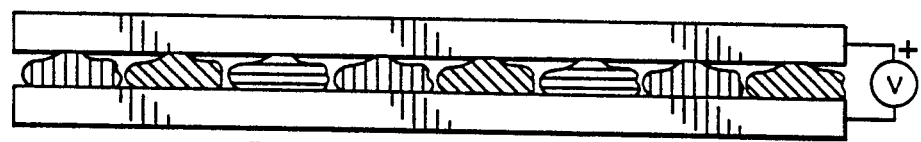
Figure 14C:
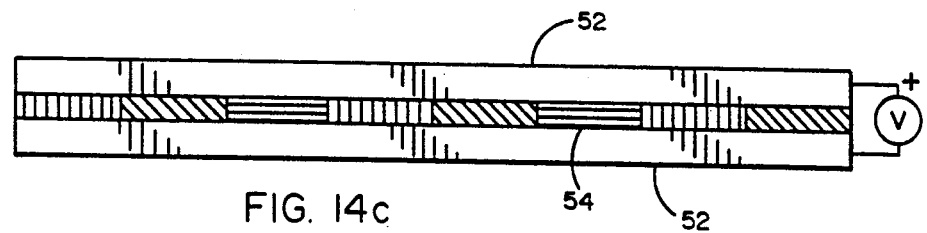

A second embodiment of the invention comprises a different method of mixing and placing the LED slivers between alignment plates. In this second embodiment, instead of using a curable epoxy material, glass is used because it is amenable to vacuum deposition of electrodes, has a very controllable etch rate and has a high degree of resistance to heat and moisture. A low melting temperature glass is used to avoid damaging the LED slivers with excessive heat. In the first step of this alternative embodiment, that is the step performed first after the LED slivers 23 are fabricated as previously described, the LED slivers are mixed with molten glass 40 using heater coils 46 and a tension feedback mechanism 48 and formed into a cylinder as shown in FIG. 12. The LED and molten glass mixture is drawn into a fiber 44. The tension feedback mechanism 48 shown in FIG. 12 monitors the diameter of the fiber 44 and adjusts the tension to the diameter at a desired constant dimension. Three different color fibers are made, one for each of the colors red, green and blue. The fibers receive plastic coating 49, are wound on a spool 50 and then sliced or cut into lengths equal to the screen width and placed between two alignment plates 52 as shown in FIG. 13. The plates are then heated and a voltage is applied to align the LED slivers 23 as shown sequentially in FIGS. 14(a), (b) and (c). The glass fibers 44 flow together to form a continuous plate 54 of material which can then be processed as previously described for the first embodiment of the invention.

This second embodiment of the invention overcomes certain potential disadvantages of the first embodiment. By way of example, certain steps of the first embodiment are not necessarily amenable to the processing of polymers. The LEDs may react with the plastic material or epoxy over some length of time and the plastic may become brittle or discolored due to local heating affects. Achieving uniform etch rates with plastics is difficult due to the nature of their long polymer chain and amorphous structure. Furthermore, the deposition of electrodes onto plastic would also be difficult, as this step typically requires the sample to be kept in a vacuum at elevated temperatures. Also, spreading the mixture of LED slivers and liquid support material over a large screen presents certain problems involving quality control because only after the screen is built can the uniformity of the LED slivers be tested. Finally, as previously described, multi-color displays would be made of multiple transparent screens made of red, green and blue LEDs sandwiched together. This technique would, of course, triple the cost as compared to a monochrome display. On the other hand, this described second embodiment of the invention allows the LED uniformity to be checked at the single row level. The fiber spools can be scanned for areas where the LED density is poor, using an absorption measurement system. This allows bad fiber to be detected and replaced before an entire screen is built. In addition, all three colors are contained in a single sheet of glass. Thus opaque electrodes can be used for one side of the screen. This permits higher current to be carried and provides a reflective back contact that will increase directionality. Thus, this second embodiment of the invention introduces desirable quality control in fabrication steps that can reduce costs substantially while improving quality. Furthermore, this improvement is based upon the use of glass and fiber manufacturing practices, both of which are well known in the industry.

It will now be understood that what has been disclosed herein comprises a novel display screen structure and method of manufacturing such screens for use, for example, in large screen television displays. The process of the present invention is one which can be accomplished with no new materials, no critical geometric requirements such as critical separations, and alignments and only low voltage drivers. The combination of these features results in a technology which can be easily scaled to large sizes to provide relatively low-cost large screens for televisions. An important step in the disclosed embodiment of the present invention is the alignment of a large plurality of columnar-shaped light emitting diode slivers in either uncured optical epoxy or in molten glass fibers by applying an electric field through a mixture of such slivers and epoxy or glass and then curing the epoxy or allowing the glass to harden to effectively fix the light emitting diode slivers in that aligned configuration. The light being emitted by such diodes, is thereafter controlled by orthogonally directed electrodes which are optically transparent and which are placed on one or both of the opposing surfaces of the thin plate-like structure fabricated in accordance with the invention.

Those having skill in the art to which the present invention pertains, will now as a result of the applicants' teaching herein, perceive various modifications and additions which may be made to the invention. Thus for example, the precise materials disclosed herein for use in the fabrication of the present invention, as well as the steps disclosed herein and the sequence of such steps as disclosed herein, all may be readily altered while preserving the principal advantageous features of the novel screen display of the present invention. Furthermore, additional steps may be added and additional features may be added to the structure of the result of the process of the present invention while still achieving the novel and highly advantageous characteristics thereof. Further, while the display screens disclosed herein may be most advantageously used in television applications, they are clearly not limited to such use. Accordingly, all such modifications and additions are deemed to be within the scope of the invention, which is to be limited only by the claims appended hereto.

We claim:

1. A method of fabricating an electronic display screen; the method comprising the following steps:
    a) providing a light emitting PN junction wafer on a substrate;
    b) etching said wafer to form a plurality of PN junction columns on said substrate;
    c) separating said columns from said substrate;
    d) mixing said columns with a molten glass;
    e) forming a plurality of elongated glass fibers from said mixture of columns and glass;
    f) aligning said columns in said fibers to form a substantially uniform array of parallel columns therein; and
    g) affixing orthogonally oriented electrodes to opposite common axial ends of said columns for applying selected voltages to selected ones of said columns.

2. The method recited in claim 1 wherein said wafer comprises a sacrificial buffer layer between said junction and said substrate and wherein step c) is performed by etching said sacrificial buffer layer.

3. The method recited in claim 1 wherein step f) is performed by applying an electric field to the fibers of step e).

4. The method recited in claim 1 further comprising the step of:
   h) affixing the electrodes on common axial ends of said columns to a glass substrate.

5. A method of fabricating a display screen for generating visual images from an array of pixels controlled by selectively applied voltages; the method comprising steps of:
   a) forming a plurality of light emitting diode slivers;
   b) mixing said slivers with molten glass;
   c) drawing and sliver and glass mixture into a glass fiber and cutting the fiber into a plurality of equal length fibers;
   d) applying an aligning electric field to align said slivers in said fiber;
   e) exposing the axial ends of said slivers; and
   f) affixing transparent electrodes to said axial ends for applying said voltages to selected ones of said pixels.

6. The method recited in claim 5 wherein in step f) the electrodes affixed to coplanar axial ends of said slivers are parallel to one another and are perpendicular to the electrodes affixed to the opposite axial ends of said slivers.

* * * * *